(12) United States Patent
Bray (10) Patent No.: US 10,799,029 B2
(45) Date of Patent: Oct. 13, 2020

(54) PORTABLE TABLET, SMARTPHONE, LAPTOP, NOTEBOOK, AND PERIPHERAL DEVICE STAND

(71) Applicant: Christopher Tyler Bray, Charleston, SC (US)

(72) Inventor: Christopher Tyler Bray, Charleston, SC (US)

( * ) Notice: Subject to any disclaimer, the term of this patent is extended or adjusted under 35 U.S.C. 154(b) by 165 days.

(21) Appl. No.: 15/700,816

(22) Filed: Sep. 11, 2017

(65) Prior Publication Data

US 2018/0199724 A1   Jul. 19, 2018

Related U.S. Application Data

(60) Provisional application No. 62/446,863, filed on Jan. 17, 2017.

(51) Int. Cl.
| | | |
|---|---|---|
| *F16M 13/02* | (2006.01) |
| *A47C 7/72* | (2006.01) |
| *F16M 11/20* | (2006.01) |
| *F16M 11/38* | (2006.01) |
| *H05K 5/02* | (2006.01) |
| *F16M 11/10* | (2006.01) |
| *F16M 11/04* | (2006.01) |
| *G06F 1/16* | (2006.01) |

(52) U.S. Cl.
CPC ............. *A47C 7/72* (2013.01); *F16M 11/041* (2013.01); *F16M 11/10* (2013.01); *F16M 11/2021* (2013.01); *F16M 11/2078* (2013.01); *F16M 11/38* (2013.01); *F16M 13/022* (2013.01); *H05K 5/0234* (2013.01); *F16M 2200/022* (2013.01); *F16M 2200/044* (2013.01); *F16M 2200/06* (2013.01); *F16M 2200/08* (2013.01); *G06F 1/1626* (2013.01)

(58) Field of Classification Search
CPC ........ F16M 13/00; F16M 13/022; A47C 7/72; A47C 7/68; A47B 23/02; A47B 23/002; A47B 23/007
See application file for complete search history.

(56) References Cited

U.S. PATENT DOCUMENTS

| 376,593 | A | * | 1/1888 | Greenawalt |
| 485,471 | A | * | 11/1892 | Morrison |
| 3,698,328 | A | * | 10/1972 | Weir ................ A47B 23/025 |
| | | | | 108/49 |
| 5,161,766 | A | * | 11/1992 | Arima ................ A47B 23/02 |
| | | | | 248/444.1 |

(Continued)

*Primary Examiner* — Sarah B McPartlin (57) ABSTRACT

A portable tablet, smartphone, laptop, peripheral device, and other objects stand that comprises a mounting apparatus, a tray, a base attachment, and a seat. A user's bodyweight is used to stabilize the seat and the stand is coupled to the seat to stabilize the stand and its comprising entities. Straps coupled to the seat can be coupled together to secure said seat. The stand can be comprising members that rotate into a single member to be housed. The tray can be folded outward from the stand and used to support objects. A hinged member, and a member, which is coupled to the hinged member, that smartphones and tablets can be coupled to, can be set to make a zero-degree angle with a middle member or rotated 180-degrees and set. The base attachment can be coupled to a plurality of objects in which can result in stabilizing the stand and the tray.

16 Claims, 6 Drawing Sheets

(56) References Cited

U.S. PATENT DOCUMENTS

| | | | |
|---|---|---|---|
| 6,353,529 B1* | 3/2002 | Cies .................. | G06F 1/1616 248/917 |
| 2002/0078862 A1* | 6/2002 | Bieza .................. | A47B 23/02 108/43 |
| 2011/0147547 A1* | 6/2011 | Fitzpatrick .......... | A47B 23/043 248/157 |
| 2017/0119159 A1* | 5/2017 | Mailloux .............. | A47C 4/04 |

* cited by examiner

PORTABLE TABLET, SMARTPHONE, LAPTOP, NOTEBOOK, AND PERIPHERAL DEVICE STAND

BACKGROUND OF THE INVENTION

Field of the Invention

The present invention is a portable tablet, smartphone, laptop, keyboard, notebook, and peripheral device stand and desk that can all be supported by a user without a user having to actively hold or attach to themselves, the present invention, or any object outside of the present invention within their vicinity, and the present invention can be used anywhere there are platforms or anywhere a user can sit, stand, or lay.

Related Art

There exist cases to carry tablets, smartphones, laptops, keyboards, notebooks, and other peripheral devices so that the user can travel. There even exist devices to mantle the electronic devices previously mentioned so that the user can utilize these electronic devices in a convenient manner. However, the devices that exist and that are portable cannot be used without a table or something to latch the device onto or connect the device to.

The devices that do exist that can be utilized without such are not portable and only hold one electronic device, such as a tablet, at a time. Furthermore, much of the related art requires the user to look down to utilize the electronic devices or have to hold the devices such that the tablets and laptop screens are at eye level. This is uncomfortable and affects the user's posture.

There exists a need for a device that supports tablet, laptop, smartphone, electronic devices, peripheral devices, and a plurality of objects, that'd be put on a table or desk, usage without compromising the user's posture and provides convenient placement of the tablet, smartphone, laptop, notebook, or peripheral device. Furthermore, there exist a need for a portable device to support the use of tablets, laptops, and other peripheral devices that is convenient to set up in an operative condition and can be used independent of a table, a like entity, or room on the floor. A vast majority of prior art requires for the devices to be permanently mounted. And none that are not permanently mounted offer both a mounting apparatus and a tray. None of the prior art allows a user to use their bodyweight in order to mount a device such as a tablet at eye level without having to attach something to themselves.

SUMMARY OF THE INVENTION AND ADVANTAGES

The subject invention has a seat that allows a user the option to utilize their bodyweight to support the stability of the present invention when set in one of its operative conditions. To do so, the user places said seat of the present invention under a part of their body and couples the stand portion of the subject invention to the seat. This feature stabilizes said stand and allows the present invention to be used anywhere the user can sit, stand, or lay. A hinged tray coupled to said stand portion of the present invention provides a desk surface for a user anywhere said user can sit, stand, or lay. Optional elastic buckle straps attached to the seat allow the user the option of connecting the elastic buckle straps through a continuous loop path and coupling the buckle members. This loop can enclose the user, an external object, such as a chair, or both. The elastic buckle straps can stabilize the seat; thus, stabilizing the present invention by coupling said stand portion of the present invention to the seat. Furthermore, the elastic buckle straps can offer supplementary support for the stabilization of the stand comprising the present invention. The present invention can be put into a compact/portable form. This is done by decoupling the stand portion from a base attachment, and sequentially folding, in a geometric manner, the remaining members and components of the present invention. Furthermore, the coupling unit, which acts as a base attachment for the stand portion of the present invention, can be coupled to a plurality of different objects in order to stabilize said stand portion and said tray portion of the present invention. It is to be understood that the subject invention can be set as a stand anywhere a coupling unit is available. The subject invention can also act as a stand for an extremely diverse array of items and as a platform to enable playing video games.

BRIEF DESCRIPTION OF DRAWINGS

These and other features and advantages of the present invention will be better elucidated as the same is further understood by reference to the following detailed description when in connection with the provided drawings, wherein.

DETAILED DESCRIPTION OF THE DRAWINGS

The following section will make numeral references to the figure provided, wherein the numerals correspond to like corresponding parts provided in the figures.

Furthermore, the following section will refer to length, width, and depth. It is to be understand that length is referring to the vertical dimensional component relative to the perspective provided in the figures. Length refers to the dimensional aspect that is represented by going up and down the page relative to that figure. A component placed vertically on the page and the length is stated as equal to 'x.' If that same component is then placed horizontally, its width is now 'x.' Width refers to the horizontal dimension of the component. Depth refers to how far in or out of the page that the component would dimensionally extend.

The following section will also refer to a stand portion and a tray portion comprising the subject invention, in which said stand portion is comprising a plurality of members and a mounting apparatus.

It is to be noted that the following detailed descriptions provided describe particular embodiments of the present invention. The present invention can take on a plurality of embodiments, and, in no way does, the following detailed descriptions limit or intended to limit the scope of the present invention.

The present invention is used as one potential mode of operative condition, but is not limited by said mode, by rotating, in a linear motion, a lower member 24 and a bottom member 28 from out of a cavity in a middle member 16. A tablet, mount, computer, or other device is then coupled to the present invention utilizing one of many possible embodiments of a mounting apparatus that is used to embody the present invention. A hinged ball joint 14, coupled to the upper front portion of said middle member 16, can be pivoted 180-degrees to alternate the incline of said tablet, and hinged tray members 18, 50, and 52 can be folded 90-degrees away from the surface of said middle member 16 in order to function as a platform for a user. Said tray is to be in between the user and the middle member 16. If the user chooses to utilize a seat 46, then the user puts said seat 46 under themselves such as under their legs, thighs, or butt, and then couples said bottom member 28 of the stand portion of the present invention to said seat 46 of the present invention. A user can also couple said bottom member 28 to a coupling unit 30 of the present invention, which said coupling unit 30 is also present on said seat 46, and said coupling unit 30 can be coupled to a plurality of items, but are not limited to said items, such as: a table; a clamp; a bike; a desk; a counter; a plane seat; and the interior of a car. The user can adjust the positioning and orientation of the present invention by means of joints that couple the plurality of members of the present invention together. When the user wishes to transport the subject invention, they will utilize an operative condition known as compact mode and is described in detail in a further section.

Furthermore, electrical wiring and charging capabilities are included amongst the potential embodiments of the subject invention. The scope of the subject invention is not limited to said wiring or capabilities.

Figure 1:
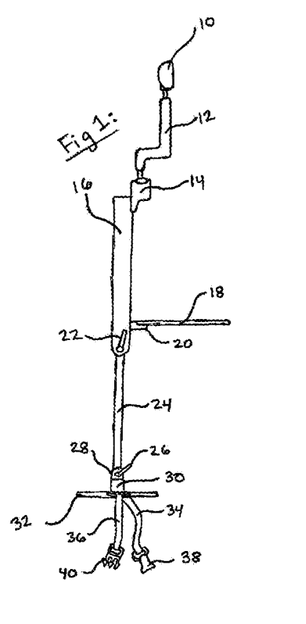
FIG. 1 depicts a left side perspective view of the subject invention set in one of its operative condition.

Referring to FIG. 1, the present invention, in one embodiment, is shown when initially set in one of its operative conditions. This is before a tablet, smartphone, laptop, peripheral device, or other items has been coupled to the present invention. It is to illustrate, relative to FIG. 2, how the user can adjust the angles between a plurality of coupled members to better suit the utilization of the present invention relative to the user. The entirety of the tray is unfolded and a hinged tray member 18, of a tray, and a support platform 20 is shown. The mounting apparatus 10 is coupled to a top member 12. Said top member 12 is coupled to a hinged ball joint 14. Said hinged ball joint 14 is coupled to a middle member 16. Said coupling of the hinged ball joint 14 and the middle member 16 can be done through means of using a nut but is in no way limited to such means, since a plurality of other means can be used. Said middle member 16 is coupled to a lower member 24 by an adjustable lock handle 22. Said lower member 24 is coupled to a bottom member 28 by an adjustable lock handle 26. The bottom member 28 is shown coupled to a coupling unit 30, and said coupling unit 30 acts as a base attachment for the stand portion of the subject invention. Said coupling unit 30 is coupled to a seat 46, and said seat 46 is coupled to a seat cover 32. This is done by partially encasing said seat 46 in said seat cover 32. In one embodiment of the subject invention, elastic straps 34 and 36 are coupled to the sides of said seat 46. Buckle members 38 and 40 are coupled to said elastic straps 34 and 36, and said buckle members 38 and 40 are shown hanging and are not buckled together. Said lower member 24, said seat 46, said bottom member 28, said hinged member 14, said mounting apparatus 10, said tray, and said middle member 16 can be made of a plurality of materials, but are not limited to, such as: carbon fiber; wood; plastic; a composite material; fiberglass; a metal; or any light weight solid. Furthermore, the particular joints used in this one possible embodiment of the present invention can be replaced by a plurality of methods known to someone of ordinary skill in the art. Some examples of such joints, but are not limited to, include varying embodiments of: hinged joints; swing joints; hydraulic mechanisms; gear configurations; ball joints; and pivot joints. Furthermore, the stand portion of the present invention can take on a plurality of embodiments. Some examples of said embodiments include, but are not limited to, a gooseneck stand, a selfie stick or one of its many alternatives, or a plurality of possible embodiments of a stand apparatus. Possible embodiments of any of a plurality of stands can also include extendable members but are not limited to said extendable members. For best functionality of the present invention, an embodiment where the joints can be locked has been utilized, but the scope of the present invention is not limited to such joints or methods. Furthermore, sensors could be utilized to mechanically adjust the subject invention as to mount a plurality of objects at a particular location relative to a user. Such an example includes, but is not limited by any means to said example, a tablet being automatically set at a user's eye level through automatic adjustment of the angles between the plurality of members comprising the subject invention according to data said sensors would provide. Furthermore, attachments such as, but are not limited to, cup holders could be coupled to the subject invention.

Figure 2:
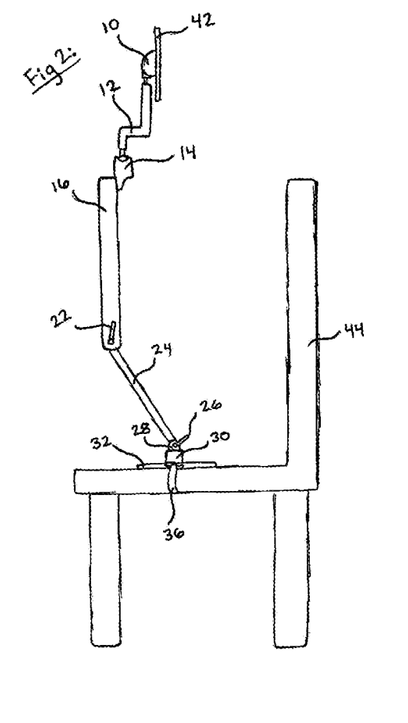
FIG. 2 is one configuration of the present invention coupled to a supporting object, a chair, which is optional for the user, and adjusted for a general preferred configuration to allow the user to utilize the present invention.

For purely illustrative purposes, the subject invention, in FIG. 2, is shown coupled to a chair 44. This is not intended to be limiting in anyway in regard to the possible application of the subject invention. The configuration in FIG. 2 can be utilized, with or without the elastic straps 28 and 34, on any surface or platform that the user can feasibly sit, lay, or stand on as long as a user can apply bodyweight to said seat 46 or as long as a coupling unit 30, that has been stabilized by coupling said coupling unit 30 to an object, is available for said bottom member 28 to be coupled to. Some, but not all, examples of these possible objects include: airplane seating; beds; couches; chairs; tables; a plurality of embodiments of furniture; and desks. Specifically referring to FIG. 2, the present invention is shown in an ideal operative condition, as in the members have been adjusted for convenient use for the user. The tray is shown supporting a peripheral device, and a tablet 42 has been coupled to the mounting apparatus 10. In this one embodiment of the subject invention, the mounting apparatus 10 comprises magnetic properties and the tablet 42 has a magnetic plate coupled to the back of it which allows the tablet 42 to mount to the mounting apparatus 10. Similar methods and apparatuses are already on the market such as the Naztech Ultra-Thin MagBuddy Plates and MagBuddy Magnetic Mount, but the possible embodiments comprising the subject invention are not limited to such. Ideally, the user would sit on top of the seat 46 and seat cover 32 with the lower member 24 intersecting through the middle opening between the user's legs; however, the present configuration of the subject invention can be utilized otherwise. The user can stand and utilize the subject invention in the present configuration.

Figure 3:
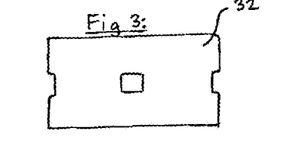
FIG. 3 is a top view of a seat cover.

FIG. 3 illustrates one embodiment of a seat cover 32. A section is cut out of said seat cover 32 so that the coupling unit 30 can be placed through the middle cut out section of the seat cover 32. This is to ensure, that when said seat cover 32 is coupled to said seat 46, that said bottom member 28 can be coupled to said coupling unit 30 without the seat cover 32 acting as a barrier between the coupling of said bottom member 28 and said coupling unit 30. Another embodiment of said seat cover 30, but is not limited to, would be to couple straps to said seat cover 32. If this were done, the cutout sections in said seat cover 32 for the elastic straps 34 and 36 of said seat 46 would no longer be necessary; Though, the cutout sections of said seat cover 32 could be kept. The dimensions of said seat cover 32 are mated to the dimensions of said seat 46.

Figure 4:
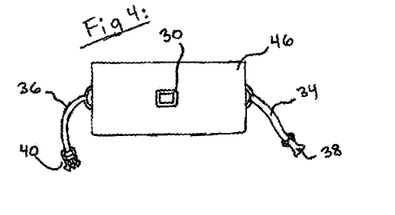
FIG. 4 is a top view of a seat as it is configured and designed to be contained in said seat cover.

FIG. 4 shows one embodiment of said seat 46 without said seat cover 32. Said coupling unit 30 is shown coupled to said seat 46. The elastic straps 34 and 36 are shown coupled to the side handles of said seat 46. A male buckle 40 is coupled to said elastic strap 36, and a female buckle 38 is coupled to said elastic strap 34. However, 38 and 40 could switch said elastic straps to which they are coupled, and this would not affect functionality. An alternative embodiment could use magnetic components on the ends of said elastic straps 28 and 34 or could use hooks or latches on the ends of said elastic straps 38 and 40. Another embodiment to replace for the strap configuration would be utilizing a ratchet-action band clamp. Said seat 46 can be made of any durable solid, but a lightweight plastic will suffice. Said buckles 38 and 40 are to be made of a plastic or composite and is not limited to said materials. Said elastic straps 34 and 36 are to be made of an elastic cloth material such as spandex, but is not limited to spandex. The coupling of the bottom member 28, or any base embodying the base of the stand portion of the present invention, with that of said seat 46 of the present invention could be done a plurality of ways which are not limited to: utilizing buckling members between the stand portion of the present invention and said seat 46 of the present invention; utilizing a latching mechanism to couple said stand portion of the present invention and said seat 46 of the present invention; utilizing threaded members to couple said stand portion of the present invention with that of the seat 46 of the present invention; or by sliding one of the members into the grooves of the other. Some different embodiments of said seat 46 of the present invention include, but are not limited to: hinged members comprising the seat 46 to allow for folding of said seat 46; coupled members comprising said seat 46, in which said coupled members slide in and out of each as to allow said seat 46 to be compacted; and a slanted base of said seat 46 as to help further stabilize said seat 46.

Figure 5:
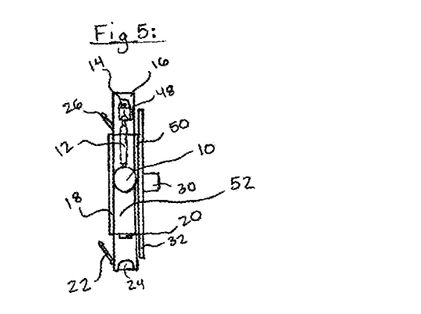
FIG. 5 is a top view of the front of the present invention compacted into its compact/portable form.

Referring to FIG. 5, the present invention, in the condition of what is to be referred to as compact mode, is shown. Said lower member 24, a portion of said adjustable lock handle 26, and said bottom member 28 are shown rotated into and housed in a cavity 54 present in the face of said middle member 16 opposite the face of said middle member 16 exposed relative to the perspective provided in FIG. 5. Relative to the configuration in FIG. 1, said rotation would have rotated said lower member 24, a portion of said adjustable lock handle 26, and said bottom member 28 180-degrees in the clockwise direction. The hinged tray members 18, 50, and 52 are shown folded into their compact condition. As a result, a hinged tray member 52 is parallel with the plane of the page, and said hinged tray members 18 and 50 are perpendicular to the plane of the page and are dimensionally extending into the plane of the page. Said mounting apparatus 10 is shown forming a zero-degree angle with a surface of said middle member 16. Said hinged ball joint 14 is shown aligning the top member 12 with said middle member 15. This is done by rotating said hinged ball joint 14 along the rotational axis of the page to form a zero-degree angle between the top member 12 and said middle member 16. Said seat cover 32 and said seat 46, is shown coupled to the tray portion of the subject invention using one of many methods such as, but is not limited to: magnets coupled to both the underside of said seat 46 and an underside of either said hinged tray members 18 and 50, in which said magnets would couple said seat 46 and both the stand and tray portion of the subject invention together by coupling said seat 46 to either undersides of hinged tray members 18 and/or 50; coupling said seat 46 to the stand and tray portion of the present invention using said elastic straps 34 and 36 and said buckles 38 and 40, in which said elastic straps 34 and 36 would wrap around the stand and tray portion of the subject invention and couple said seat 46 to said stand and tray portion of the subject invention. The overall configuration depicted in FIG. 5 is the ideal configuration for transporting one embodiment of the subject invention when not set for use.

Figure 6:
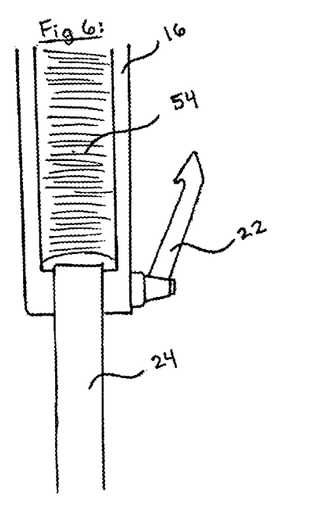
FIG. 6 is a fragmentary back view showing how a middle member and a lower member of the present invention can be coupled.

In one embodiment of the present invention, FIG. 6 depicts the coupling of said middle member 16, which, in one embodiment, can be done with a ball joint or a plurality of other methods, and said lower member 24, which, in one embodiment, can be done with a pivot joint but is not limited to said pivot joint. FIG. 6 shows a cavity 54 in said middle member 16 that allows said lower member 24, a portion of said adjustable lock handle 26, and said bottom member 28, to be housed inside of said middle member 16 when needed. It is to be noted that said cavity 54 must be greater in length than the combined lengths of said lower member 24, and said bottom member 28. Said cavity 54 must be wider than said lower member 24 and said bottom member 28. Furthermore, there should be a cutout in said middle member 16 mated to the remaining portion of said adjustable lock handle 26, if adjustable lock handles are comprising a possible embodiment of the subject invention, that is not shown, relative to FIG. 6, inside of said cavity 54. This is better illustrated in FIG. 11. The dimensional length of said middle member 16 is greater than the combined dimensional length, as in the combined height, of said lower member 24 and said bottom member 28. The width and depth of said middle member 16 is also greater than the width and depth of said lower member 24 and said bottom member 28. This is not the combined width or depth of said lower member 24 and said bottom member 28. The following will be better elucidated by FIG. 11. Furthermore, it is to be understood that a plurality of embodiments will be used for the adjustable lock handles 22, 26, and 48, and this is to help further show the plurality of joints that can be comprising the stand portion of the subject invention which are not limited to adjustable lock handles.

Figure 7:
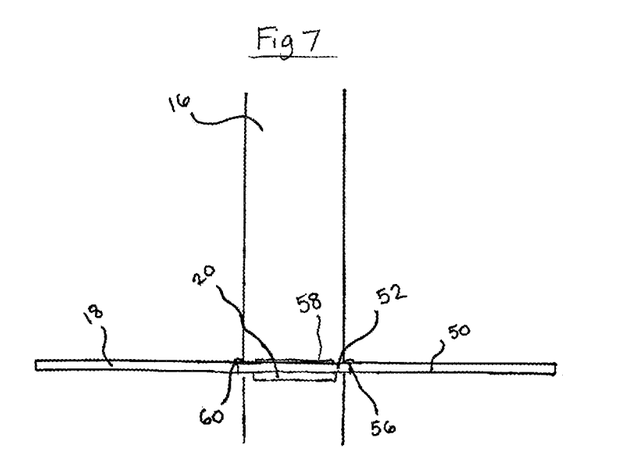
FIG. 7 is a fragmentary front view of a hinged tray connected to a middle member of the present invention while the components of said tray are unfolded, and said tray is shown in an operative condition.

Referring to FIG. 7, one embodiment of said tray portion of the subject invention is shown. Said tray portion of the subject invention is comprising hinged tray members 18, 50, and 52 in this particular embodiment of the subject invention. A hinge 58 couples hinged tray member 52 to said support platform 20, and said support platform 20 is coupled to said middle member 16. A hinge 60 couples hinged tray member 18 to hinged tray member 52. A hinge 56 couples hinged tray member 50 to hinged tray member 52. Said hinge 60 allows said hinged tray member 18 to be rotated 90 degrees in the clockwise direction relative to the orientation of 18 in FIG. 7. Said hinge 72 allows said hinged tray member 50 to be rotated 90 degrees counterclockwise relative to the orientation of 50 in FIG. 7. Said hinge 58 allows the hinged tray member 52 to be rotated 90 degrees upwards to form a zero-degree angle with the exposed surface of said middle member 16. It is to be understood that if the current orientation of said hinged tray members 18 and 50 depicted in FIG. 7 is conserved, then the formation of a zero-degree angle between hinged tray member 52 and said exposed surface of said middle member 16 will cause said hinged tray members 18 and 50 to dimensionally extend into the plane of the page. Relative to the condition of said tray portion of the subject invention provided by FIG. 7, the user can utilize said tray as any other tray would be used. Said tray is to be made of a light weight and durable metal, plastic, or composite, but is not limited to said materials. A material similar to that of carbon fiber or fiberglass would be ideal. The following dimensions given are relative to the perspective provided by FIG. 7. The length of each individual said hinged tray member 18, 50, and 52 can range from 0.05-3 inches. The width of each individual said hinged tray member 18, 50, and 52 can range from 0.5-20 inches. The depth of each individual said hinged tray member 18, 50, 52 can range from 1.0-25 inches. It is to be understood that, in the particular embodiment of the present invention, the length and depth of each individual said hinged tray member 18, 50, and 52 is equal, but the width is not represented as being equal and is not required to be. Also, neither the depth and length of each individual said hinged tray member 18, 50, and 52 don't have to be equal as is depicted in this particular embodiment of the present invention. Furthermore, in other potential embodiments of the tray portion of the subject invention can include a mechanism for adjusting the tray up and down the length of the middle member 16. A potential embodiment of said mechanism, which is not limited to, can comprise a push spring mechanism coupled to the support platform in which would engage and disengage, correlating to the pushing of a button, teeth present in the middle member 16.

Figure 8:
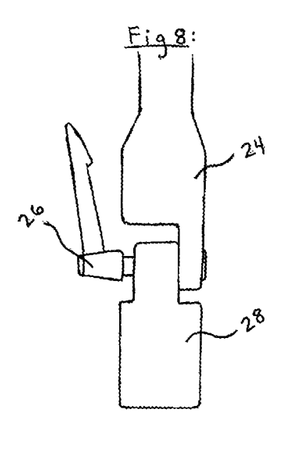
FIG. 8 is a fragmentary view of a lower member's connection with a bottom member, which allows said lower member, relative to said bottom member, to pivot either backward or forward. Said bottom member couples the other members to any of the plurality of possible base attachments.

In one embodiment, FIG. 8 depicts the coupling of said lower member 24 and said bottom member 28. In this particular embodiment of the subject invention, the lower member 24 and bottom member 28 are coupled by an adjustable lock handle 26 in which allows the user to lock the joint that could also be referred to as a hinged joint. This particular joint configuration is one of many possible embodiments of coupling points that the stand portion of the subject invention might be comprising but is not limited to such. The joint configuration shown in FIG. 8 allows the lower member 24 and bottom member 28 to pivot into and out of the plane of the page relative to the other, Other joint methods that might be used were previously stated in the FIG. 1 detailed description. In one embodiment, the geometric shape and dimensions of the bottom member 28 are mated to the cavity in the coupling unit 30.

Figure 9:
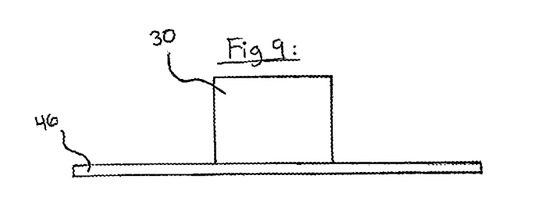
FIG. 9 is a perspective view, relative to the perspective shown of the subject invention in FIG. 1, of one embodiment of a seat without a seat cover.

In one embodiment, FIG. 9 illustrates said seat 46 without said seat cover 32 and said coupling unit 30 that is mated to couple to and hold said bottom member 28. In the middle of said seat 46, said coupling unit 30 is coupled to said seat 46. In one embodiment, said coupling unit 30 is comprising the shape of a three-dimensional rectangle. In other embodiments, said coupling unit 30 could be of the shape of a three-dimensional: star; sphere; square; triangle; cylinder; polygon; or a plurality of other geometric shape configurations. The coupling unit 30 can be placed elsewhere on the seat 46, but the middle provides a superior center of gravity. When the bottom member 28 is placed into the cavity of the coupling unit 30, a minimum distance of an ½ inch between the handle portion of the adjustable lock handle 26 and said coupling unit 30 is recommended. As a result, this restricts how far the coupling unit 30 extrudes dimensionally outward from said seat 46 relative to the location of coupling between said lower member 24 and said bottom member 28 provided, in one embodiment, by said adjustable lock handle 26. The coupling unit 30 must also not interfere with the pivoting of the lower member 24. A minimum of ½ inches, in height, of the bottom member 28 should be able to fit into the cavity of the coupling unit 30 while still meeting the previously stated requirements.

Figure 10:
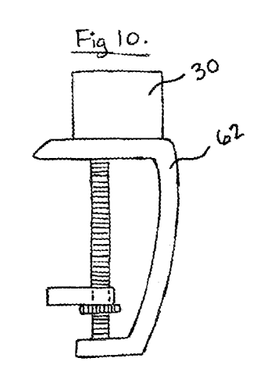
FIG. 10 is a left side perspective view of a clamp with a base attachment coupled to the top of the clamp.

FIG. 10 provides one embodiment of an object that the coupling unit 30 might be coupled to. This particular object is a clamp 62. Said clamp 62 would be coupled to something such as a table, but is not limited to a table, and stabilized resulting in the stabilization of said coupling unit 30. FIG. 10 provides a conceptual explanation of how the coupling unit 30, and whatever embodiment it might take on, might be coupled to a plurality of objects. Some of the possible embodiments, but which the subject invention is not limited to by any means, includes mounting a plurality of embodiments of the coupling unit 30, also known as the base attachment of the subject invention, to: a table; a desk; a clamp; a tripod; a suction cup; the interior of a car or plane; a car seat; an airplane seat; a chair; a wall; and many more objects. The plurality of embodiments that can comprise the coupling unit 30 was earlier discussed in relation to the coupling of the stand portion of the present invention to the seat 46.

Figure 11:
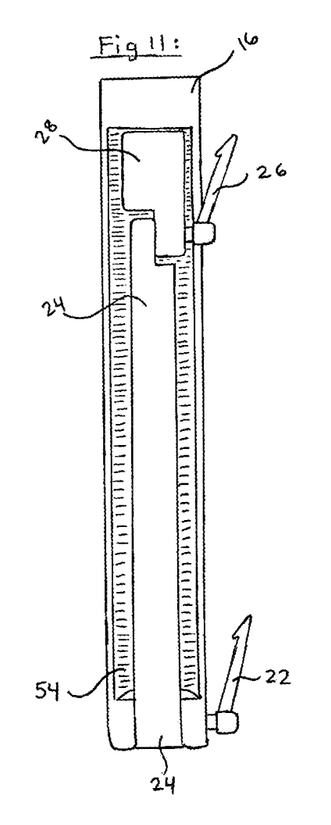
FIG. 11 is a back view of members and components comprising the present invention which are housed inside of another member.

FIG. 11 depicts one embodiment of the stand portion of the present invention. The lower member 24 and the bottom member 28 have been linearly rotated into and are now housed in the cavity 54 of the middle member 16. The hinged ball joint 14 is shown in the same embodiment and condition as is illustrated in FIG. 5. In one embodiment, a section of the middle member 16, which can also be thought as a section of the wall comprising the perimeter of the cavity 54, has been cutout and mated to fit a portion of the adjustable lock handle 26. Said cutout should allow the lower member 24 and the bottom member 28 to be housed in the cavity 54 regardless of how far out the adjustable lock handle 26 may extend. Contrary to the present embodiment, the bottom member 28 can have the same width, depth, or length as the lower member 24. The following dimensions given are relative to the perspective provided by FIG. 11. The length of the middle member 20 can range from 5-25 inches. The width of the middle member 20 can range from 0.5-4 inches. The depth of the middle member 20 can range from 0.5-4 inches.

Figure 12:
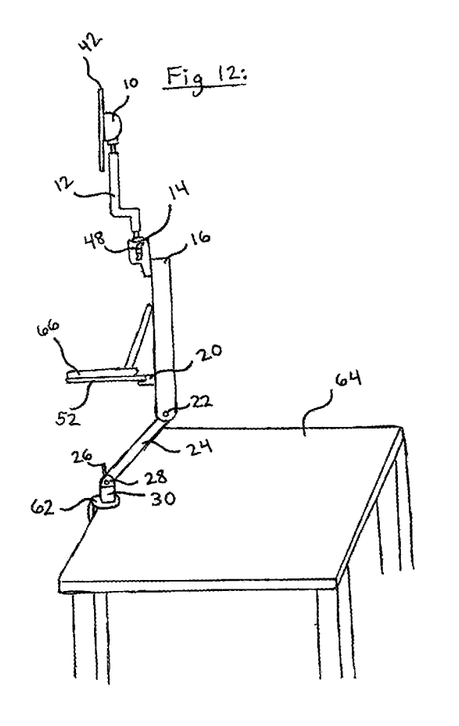
FIG. 12 is a partially isometric view showing the subject invention coupled to a table and set for use.

In one embodiment, FIG. 12 illustrates said clamp 62 coupled to a table 64 and the stand portion of the present invention coupled to said clamp 62 by means of coupling said bottom member 28 to the coupling unit 30, in which said stand portion and said tray portion of the subject invention are stabilized. The subject invention is not limited to said embodiment nor the mode of operation depicted in FIG. 12. Said tablet 42 is coupled to the mounting apparatus 10, and a laptop 66 is shown supported by said tray portion of the present invention. The adjustable lock handles 22 and 26 have been tightened as to lock the joints coupling the middle member 16 to the lower member 24 and the lower member 24 to the bottom member 28. The adjustable lock handle 48 has been tightened as to lock the hinged ball joint 14 which also locks the upper member 12 into a fixed position and stabilizes said tablet 42.

Figure 13:
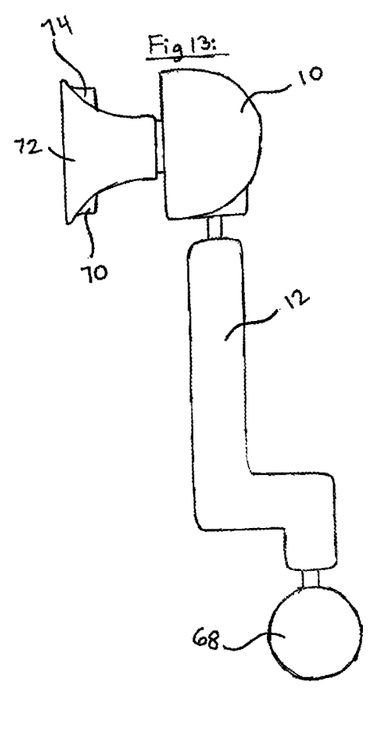
FIG. 13 is a fragmentary view of an alternative method of coupling tablets, smartphones, and other objects to the present invention using a suction cup.

In FIG. 13, one embodiment of an alternate method of coupling objects to the present invention is that of utilizing a suction cup 72. In said embodiment, said suction cup 72 is coupled to the mounting apparatus 10, though said mounting apparatus 10 could be replaced by said suction cup 72. A user would couple objects to the suction cup 72 by pressing said objects against the suction cup 72. Tags 70 and 74 allow a user to remove the suction cup 72 from a object by holding said object and pulling on either said tag 70 or 74. A few embodiments of the coupling of the suction cup 72 to the mounting apparatus 10 include, but are not limited to: coupling with screws; coupling with adhesive; coupling with a suction cup; and other methods a person of ordinary skill in the art will readily recognize. In this one embodiment, said mounting apparatus 10 need not be magnetic as was described in FIG. 2. The present invention can be embodied by a plurality of apparatuses to couple tablets, smartphones, and other objects to the present invention. Said plurality of embodiments of apparatuses can include, but are not limited to, mounts that utilize: clamping apparatuses; sticky surfaces; threaded mates; magnetism; mated slots. Possible embodiments of the present invention can comprise a computer or monitor coupled to the subject invention. Furthermore, one embodiment of the subject invention can include a mount designed to mount more than one electronic device which can be coupled and uncoupled from the remaining entities of the present invention or can be permanently coupled to said remaining entities of the present invention. In another embodiment of the present invention, a plurality of possible mounts could be alternatively utilized by alternating which mount is coupled to the subject invention.

Figure 14:
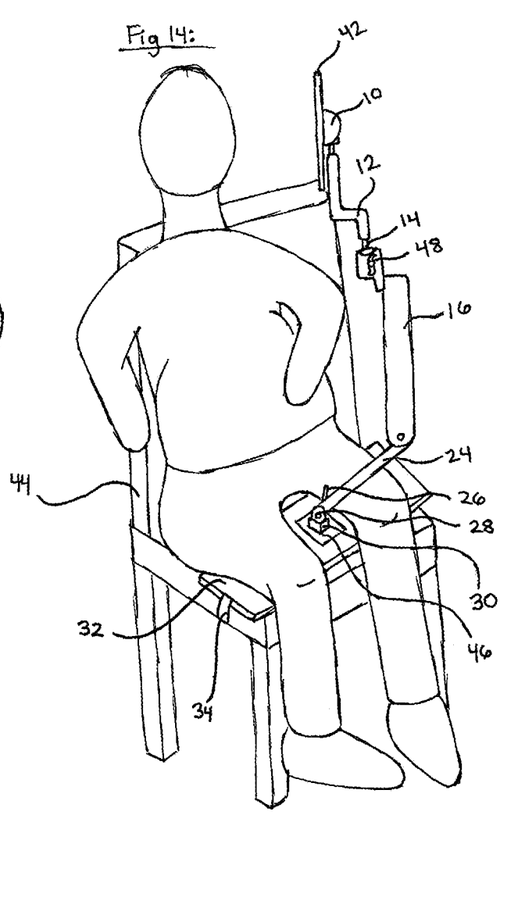
FIG. 14 is a semi-isometric view a user using their bodyweight to stabilize one embodiment of the subject invention.

FIG. 14 depicts one embodiment of the subject invention in one of many modes of its operative conditions, in which a user is sitting on the seat 46 and stabilizing said seat 46, the stand portion of the subject invention, and a tablet 42. The scope of the subject invention isn't limited to said mode of operation. Furthermore, it is to be noted that the tray portion of the subject invention, which includes hinged tray members 18, 50, and 52, has not been included, though it can also be included along with any embodiment of a tray or desk like platform. Said seat 46 is shown coupled to the chair 44 which is not necessary in this particular mode of operative condition, since a user's bodyweight would suffice in stabilizing said seat 46 and a plurality of embodiments of the subject invention in which a seat 46 is used to stabilize a stand. Said mode of operative condition is executed by placing said seat under said user's body, coupling said bottom member 28 to the coupling unit 30, and placing the lower member 24 in between the user's legs as is shown, whereby a tablet 42, but is not limited to a tablet 42, can be placed at eye level of a user. Furthermore, if the tray portion of the subject invention were included in this one embodiment, a keyboard could be placed on the said tray portion, and this, along with a mounted tablet 42 or monitor like device, would provide a user with a set up similar to a desktop computer.

Figure 15:
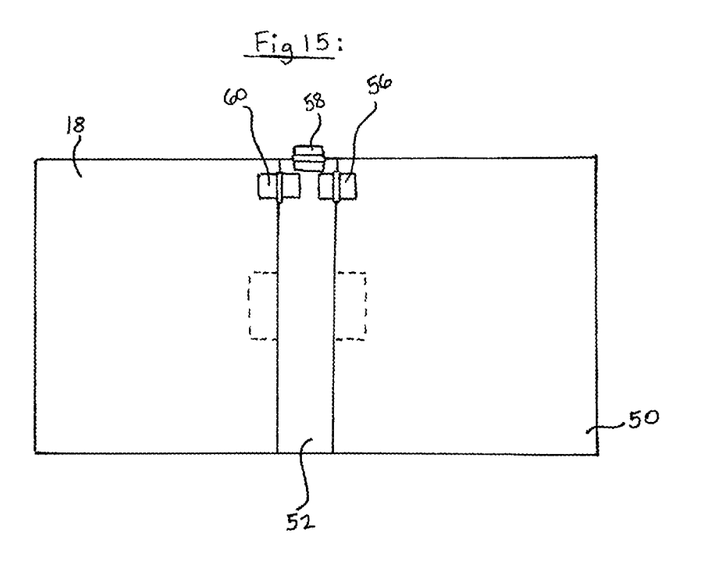
FIG. 15 is a top-view of a tray portion of the present invention.

In FIG. 15, one embodiment of the tray portion of the subject invention is shown, in which said tray portion has been isolated. The perspective provided is a top view, in which the hinges 56, 58, and 60 are shown coupling the hinged tray members 18, 50, and 52 together. Said hinged tray members 18, 50, and 52 are shown forming zero-degree angles between said hinged tray members 18, 50, and 52 that matches the same configuration, excluding the coupling of hinged tray member 52 to the stand portion of the subject invention, of said tray portion of the subject invention that is shown in FIG. 1. It is to be understood that said hinged tray members 18, 50, and 52 can be routed at the locations of the corresponding hinge 56, 58, and 60 placements. However, said routing isn't necessary. The dashed lines that each form 3 sides of a rectangle illustrate a possible embodiment of the hinged tray member 52, in which said hinged tray member 52 has extruded platforms that a portion of hinged tray members 18 and 50 are shown resting on. The purpose of said extruded platforms is to add supplementary support as to maintain the zero-degree angles between said hinged tray members 18, 50, and 52 in the case of forces that could possibly compromise said zero-degree angles, though said extruded platforms are not necessary. In one embodiment, indentions could exist on the tray portion of the subject invention in which would allow the user to securely place plates, bowls, cups, cans, phones, a computer mouse, and a plurality of other objects onto said tray portion. Said indentions would ideally exist on the face of the tray portion that is exposed in FIG. 15. Furthermore, a plurality of alternate embodiments of a tray could be used, and the scope of the subject invention is not limited to stands comprising trays of any nature. Furthermore, power devices can be coupled to the tray portion of the subject invention or to the stand portion of the subject invention. This would allow the user access to a power supply in which they could charge and power their devices. Said power supplies can embody but are not limited to: magnetic charging platforms; batteries; power strips; charging docks; USB ports; and a plurality of other embodiments. In this one of many possible embodiments of the tray portion of the subject invention, if said tray portion is decided to be included, in which coupling of the hinges 56, 58, and 60 to the hinged tray members 18, 50, and 52 has been done with an adhesive, but can also be done with any method know to someone of ordinary skill in the art or a plurality of possible methods. The usage of an adhesive isn't necessary but rather convenient.

What is claimed is:

1. A stand comprising: a lower member pivotally coupled to a middle member, where said lower member is configured to rotate into and out of said middle member; a top member pivotally coupled to said middle member, wherein said top member is configured to rotate at least 180-degrees with respect to said middle member; a hinged tray coupled to said middle member, in which said hinged tray can fold to form either a 0-degree or a 90-degree angle with said middle member; a mounting apparatus coupled to said top member, wherein a top surface of said hinged tray is configured to face said middle member and said lower member is housed inside said middle member when the stand is in a folded configuration.

2. The stand of claim 1, further comprising a mated seat; wherein, said stand and said mated seat can be stabilized by a user's bodyweight applied to said mated seat.

3. The stand of claim 1, further comprising a secured base attachment; wherein, said stand is secured by coupling said stand to said secured base attachment.

4. The stand of claim 1, further comprising a bottom member pivotally coupled to said lower member.

5. The stand of claim 1, wherein the hinged tray further comprising a left tray member, a middle tray member, a right tray member, and said left tray member can fold into an orthogonal or a coplanar position with respect to said middle tray member, and said right tray member can fold into an orthogonal or a coplanar position with respect to said middle tray member.

6. The stand of claim 1 further comprising a bottom member pivotally coupled to the lower member.

7. The stand of claim 6 further comprising a base attachment coupled to the bottom member.

8. The stand of claim 1, wherein the lower member is housed inside a cavity located in the middle member.

9. A stand comprising: a middle member; a hinged support platform coupled to said middle member; a top member pivotally coupled to said middle member; a lower member pivotally coupled to said middle member; a mounting apparatus coupled to said top member; a bottom member pivotally coupled to said lower member; and a seat base attachment, wherein the seat base attachment is configured to be secured under a user's thigh and the bottom member is configured to be coupled to the seat base attachment to stabilize the stand.

10. The stand of claim 9, wherein the bottom member is pivotally coupled to the lower member.

11. The stand of claim 9, wherein the seat base attachment comprises straps.

12. A stand configured to be secured to one of a plurality of objects comprising: a middle member; a hinged tray coupled to said middle member; a top member pivotally coupled to said middle member; a mounting apparatus coupled to said top member; a bottom member; a base attachment comprising at least one of a plurality of possible coupling apparatuses wherein said base attachment is coupled to one of said plurality of possible objects using one of said plurality of coupling apparatus and said bottom member is secured to said base attachment to secure said stand to one of said plurality of possible objects.

13. The stand of claim 12, wherein said base attachment comprises a clamp.

14. The stand of claim 12, wherein said base attachment comprises a base configured to be placed under the thigh of a user stabilizing said base attachment.

15. The stand of claim 12 comprising the bottom member is pivotally coupled to the lower member.

16. The stand of claim 12, wherein the hinged tray comprises three hinged tray members.

* * * * *